United States Patent
Su et al.

(10) Patent No.: US 7,132,717 B2
(45) Date of Patent: Nov. 7, 2006

(54) POWER METAL OXIDE SEMICONDUCTOR TRANSISTOR LAYOUT WITH LOWER OUTPUT RESISTANCE AND HIGH CURRENT LIMIT

(75) Inventors: Hung-Der Su, Kao-Hsiung Hsien (TW); Chun-Yen Huang, Hsin-Chu (TW); Chung-Lung Pai, Taipei (TW); Jing-Meng Liu, Hsin-Chu (TW)

(73) Assignee: Richtek Technology Corp., Hsinchu Hsien (TW)

( * ) Notice: Subject to any disclaimer, the term of this patent is extended or adjusted under 35 U.S.C. 154(b) by 0 days.

(21) Appl. No.: 11/109,772

(22) Filed: Apr. 20, 2005

(65) Prior Publication Data

US 2006/0138565 A1 Jun. 29, 2006

(30) Foreign Application Priority Data

Dec. 24, 2004 (TW) .............................. 93140491 A

(51) Int. Cl.
*H01L 29/94* (2006.01)
(52) U.S. Cl. .............................. 257/401; 257/E29.116; 438/186
(58) Field of Classification Search ................ 257/341, 257/342, 401, E29.112, E29.116, E29.12; 438/186, 197
See application file for complete search history.

(56) References Cited

U.S. PATENT DOCUMENTS

| 3,783,349 | A | * | 1/1974 | Beasom ...................... 257/287 |
| 4,636,825 | A | * | 1/1987 | Baynes ........................ 257/401 |
| 5,447,876 | A | * | 9/1995 | Moyer et al. ............... 438/105 |
| 6,084,266 | A | * | 7/2000 | Jan ............................. 257/341 |
| 6,121,657 | A | * | 9/2000 | Yama ......................... 257/341 |
| 6,977,414 | B1 | * | 12/2005 | Nakamura et al. .......... 257/329 |
| 2004/0195618 | A1 | * | 10/2004 | Saito et al. ................. 257/330 |

* cited by examiner

*Primary Examiner*—Eugene Lee
*Assistant Examiner*—William F. Kraig
(74) *Attorney, Agent, or Firm*—Birch, Stewart, Kolasch & Birch, LLP

(57) ABSTRACT

A power metal oxide semiconductor transistor layout is disclosed. The power metal oxide semiconductor transistor layout uses network of conductive lead line as a connection or a network connection to connect source and drain regions thereby achieves advantages of a high uniformity of current, low Rds_on, much less power loss, an actual line density two times larger than that of conventional layouts and a strengthened resistance to electron migration.

14 Claims, 17 Drawing Sheets

POWER METAL OXIDE SEMICONDUCTOR TRANSISTOR LAYOUT WITH LOWER OUTPUT RESISTANCE AND HIGH CURRENT LIMIT

BACKGROUND OF THE INVENTION

1. Field of the Invention

The present invention relates to a power metal oxide semiconductor transistor layout, and more particularly to a power metal oxide semiconductor transistor layout with a lower output resistance and a high current limit.

2. Description of the Related Art

Metal oxide semiconductor (MOS) transistors with very large line width are widely used as power switch of power management application. However, the long source and drain connection results in some drawbacks such as a severe voltage drop at metal connection. Moreover, the cell pitch of power device must be as small as possible so as to increase packing density. Thus, the line width of source and drain metal connection is limited. The length of line of source and drain connection is also limited by electron migration especially for limited line width. So, it is a dilemma to achieve a power MOS transistor with high current and high packing density layout.

Referring to FIG. 1, a conventional MOSFET current driver 14 is laid out to have a gate with a vertical serpentine pattern. The serpentine pattern is laid out to have a plurality of long strips 21 parallel to each other along the length of the layout of the current driver. Also, the serpentine pattern has a plurality of short strips 15 which connect the long strips to each other in such a manner to generate a long continuous gate. The serpentine pattern of the conventional layout is called vertical since the long strips 21 are laid out along the length of the layout of the current driver. The drain area 16 and source area 18 are located between the long strips 21 of the gate 20 in an interlace form. The drain metal 17 has a plurality of fingers 22 and the source metal 19 has a plurality of fingers 24. The drain fingers 22 and the source fingers 24 are laid out in such a manner that they are in an interlace relationship with each other and each drain finger 22 is located above a drain area 16 and each source finger 24 is located above a source area 18. Each drain finger 22 has plurality of contacts 26 with the drain area 16 underneath the drain finger 22. Each source finger 24 has plurality of contacts 28 with the source area 18 underneath the source finger 24. The conventional MOSFET current driver layout is prone to have shorts or defects. First of all, the long source and drain connection would result in severe voltage drop at metal connection. Moreover, the line width of source and drain metal connection is also limited by electron migration.

Referring to FIG. 2, another conventional layout of a MOSFET current driver 34 is shown. In the design of this conventional layout, the gate 40 is laid out to have a lateral serpentine pattern. The serpentine pattern is laid out to have a plurality of long strips 41 and a plurality of short strips 43. The long strips 41 are laid out parallel to each other along the width of the current driver 34. The short strips 43 are laid out to connect the long strips to each other in such a manner to generate a long continuous gate. The serpentine pattern of this design is called lateral since the long strips 41 are laid out along the width of the current driver 34. The drain areas 36 and source areas 38 are located between the long strips 41 of the gate 40 in an interlace form. Also, in the layout there are only two metal strips which substantially overlap the serpentine patterned gate; one serves as the drain metal 37 and the second serves as the source metal 39. The drain metal 37 has a plurality of drain contacts 42a, 42b, 42c, 42d, 42e, 42f and 42g and the source metal 39 has a plurality of source contacts 44a, 44b, 44c, 44d, 44e, 44f and 44g. Each drain contact is placed on a drain area 36 to connect the drain metal 37 to the drain area 36 and each source contact is placed on a source area 38 to connect the source metal 39 to the source area 38. This conventional MOSFET current driver layout also has several drawbacks. First of all, the line width of source and drain metal connection line is limited due to the source and drain connected by high resistance diffusion layer. Moreover, the line length of source and drain connection is also limited by electron migration.

In view of the drawbacks mentioned with the prior art, there is a continued need to develop new and improved power MOS transistor layout that overcome the disadvantages associated with prior art. The requirements of this invention are that it solves the problems mentioned above.

BRIEF SUMMARY OF THE INVENTION

It is therefore an object of the invention to provide a power metal oxide semiconductor transistor layout with a lower output resistance and a high current limit.

It is another object of this invention to provide a power metal oxide semiconductor transistor layout with a high uniformity of current, low Rds_on, much less power loss, an actual line density two times larger than that of conventional layouts and a strengthened resistance to electron migration.

It is a further object of this invention to provide power metal oxide semiconductor transistor layout with a high package density.

To achieve these objects, and in accordance with the purpose of the invention, the invention provides a power metal oxide semiconductor transistor layout comprising a gate electrode with a lattice pattern on a substrate having a first area and a second area, a plurality of source regions laid in the lattice pattern, a plurality of drain regions laid in the lattice pattern, a first network of conductive lead line connecting the source regions on the first region, a second conductive plane connecting the drain regions on the first region, a third network of conductive lead line connecting the drain regions on the second region, and a fourth conductive plane connecting the source regions on the second region, each the source region is laid to be surrounded by the drain regions, wherein the first network of conductive lead line connects the fourth conductive lead, and the second conductive plane connects the third network of conductive lead line. The lattice pattern comprises a square lattice pattern, a rectangle lattice pattern, a rhombus as well as an octagon lattice pattern.

In another embodiment of the invention, the power metal oxide semiconductor transistor layout comprises a gate electrode with a strip grating pattern on a substrate having a first area and a second area, a plurality of source regions laid in the strip grating pattern and a plurality of drain regions laid in the strip grating pattern, each the source region is laid in an interlace manner with the drain regions, a first network of conductive lead line connecting the source regions on the first region, a second conductive plane connecting the drain regions on the first region, a third network of conductive lead line connecting the drain regions on the second region, and a fourth conductive plane connecting the source regions on the second region, each the source region is laid to be surrounded by four of the drain regions, wherein the first network of conductive lead line connects the fourth conductive plane, and the second conductive plane connects the third network of conductive lead line.

It is to be understood that both the foregoing general description and the following detailed description are exemplary and explanatory only and are not restrictive of the invention, as claimed.

BRIEF DESCRIPTION OF THE DRAWINGS

The present invention is best understood by reference to the following detailed description when read in conjunction with the accompanying drawings.

Common reference numerals are used throughout the drawings and detailed description to indicate like elements.

DETAILED DESCRIPTION OF THE INVENTION

Figure 1:
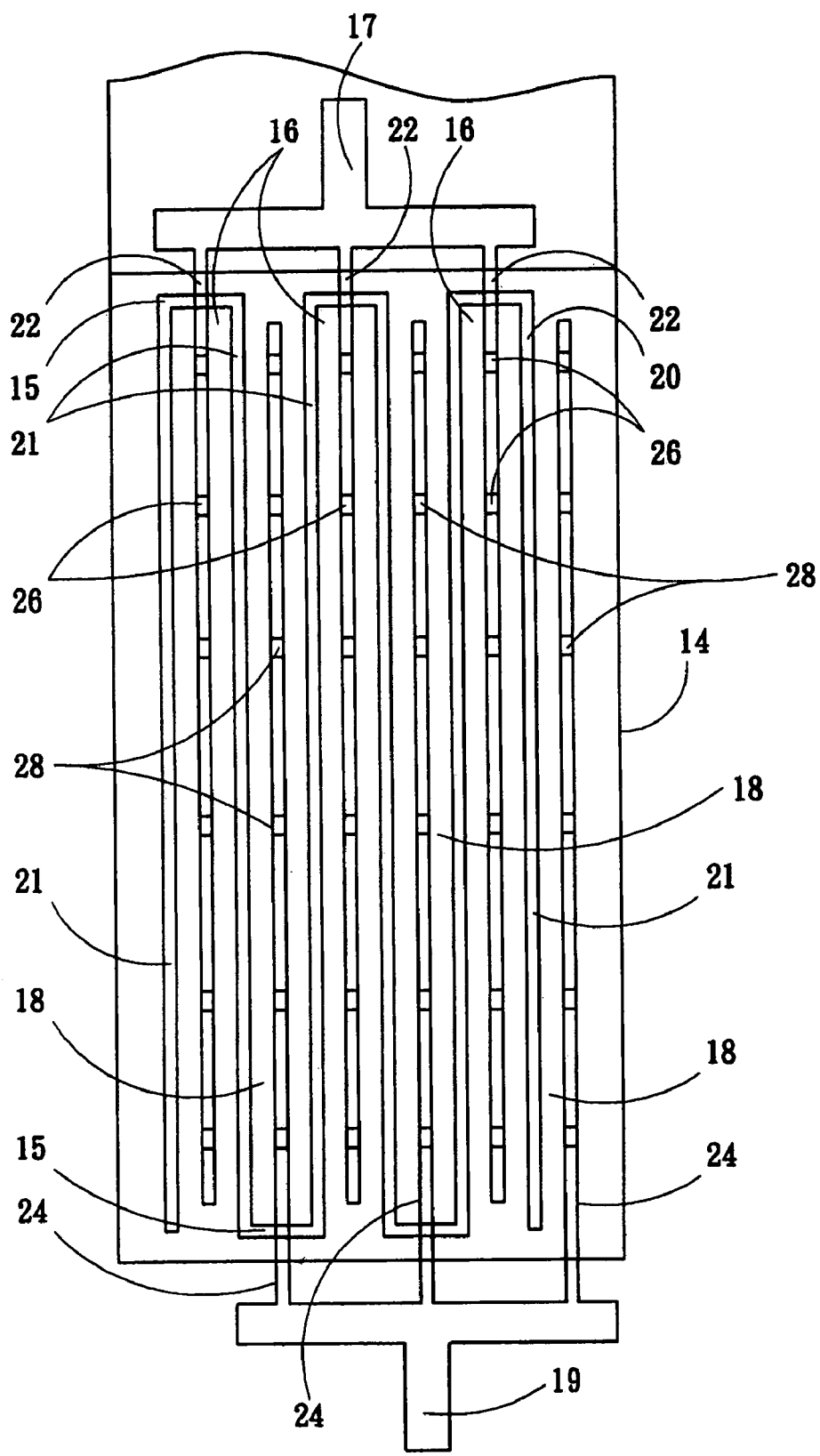
FIG. 1 shows a conventional layout of a MOSFET current driver.
Figure 2:
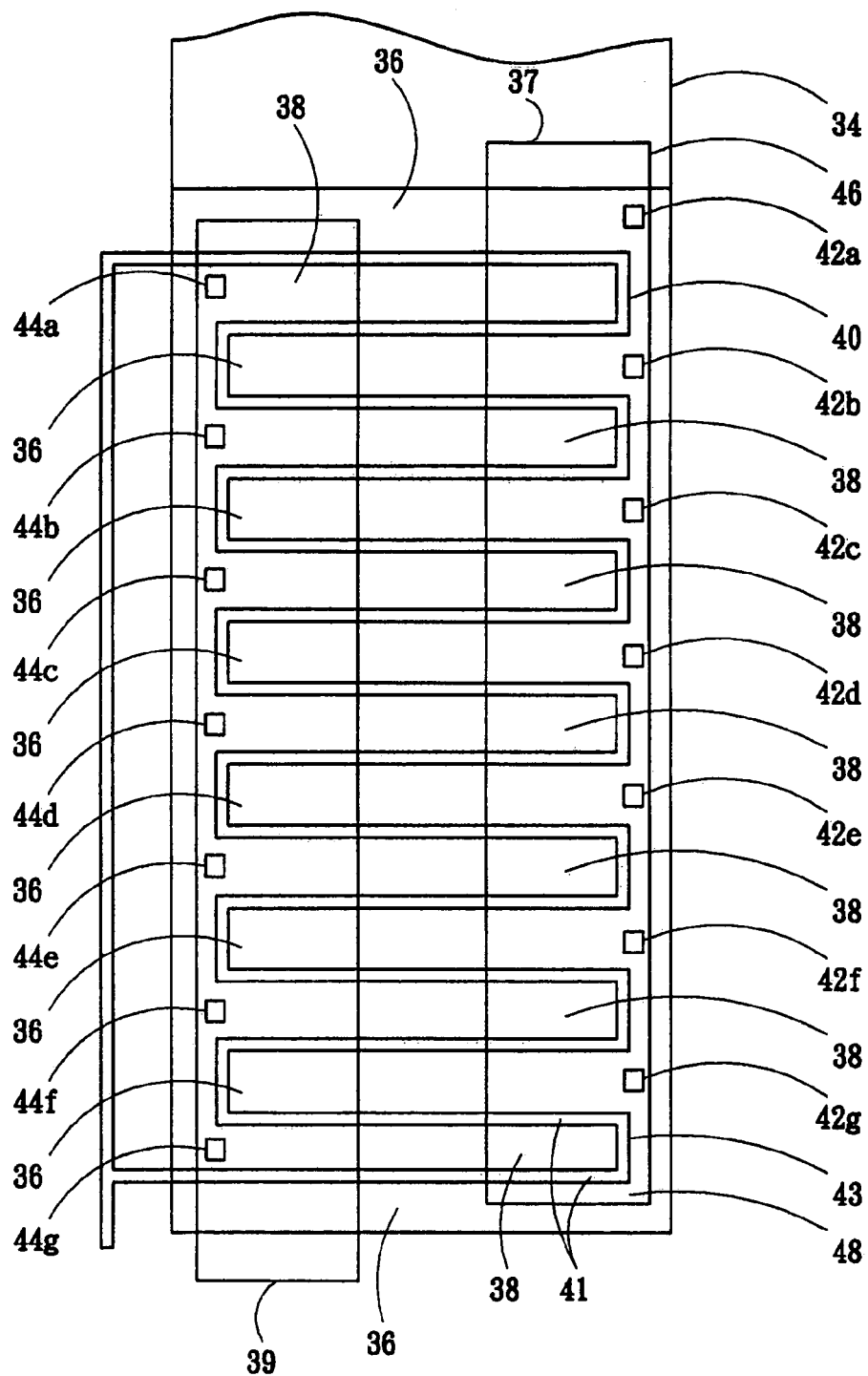
FIG. 2 shows another conventional layout of a MOSFET current driver.
Figure 3:
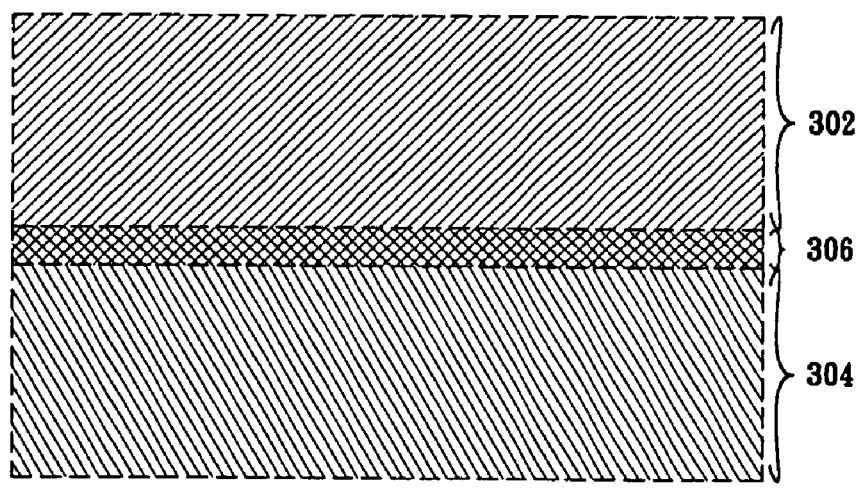
FIG. 3 shows a schematic diagram of one embodiment of a power MOS transistor layout of the invention.
Figure 3A:
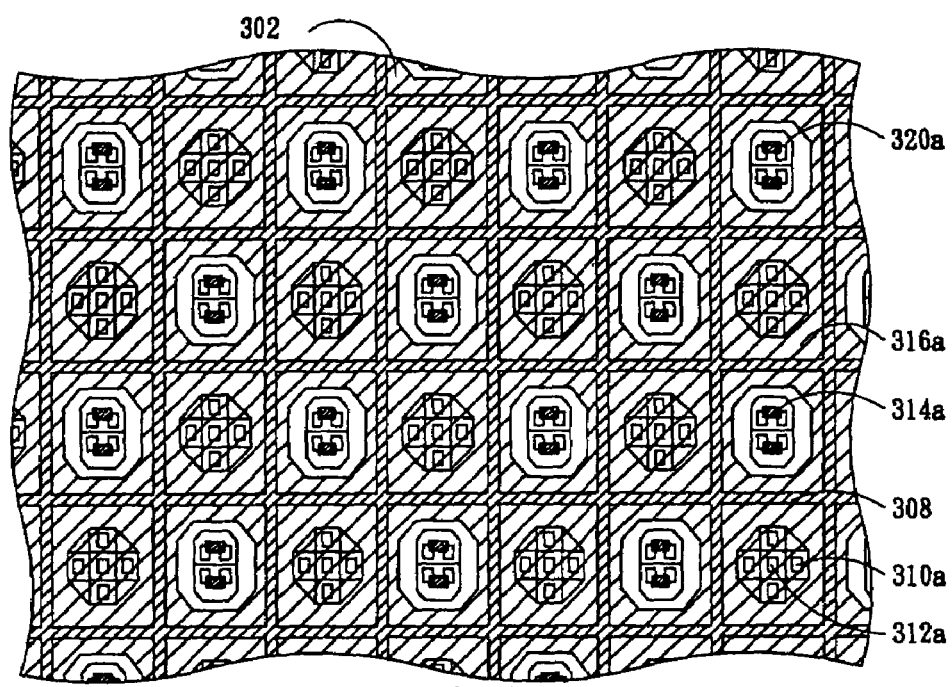
FIG. 3A shows a detail top view of a portion of the power MOS transistor layout of the invention.
Figure 3B:
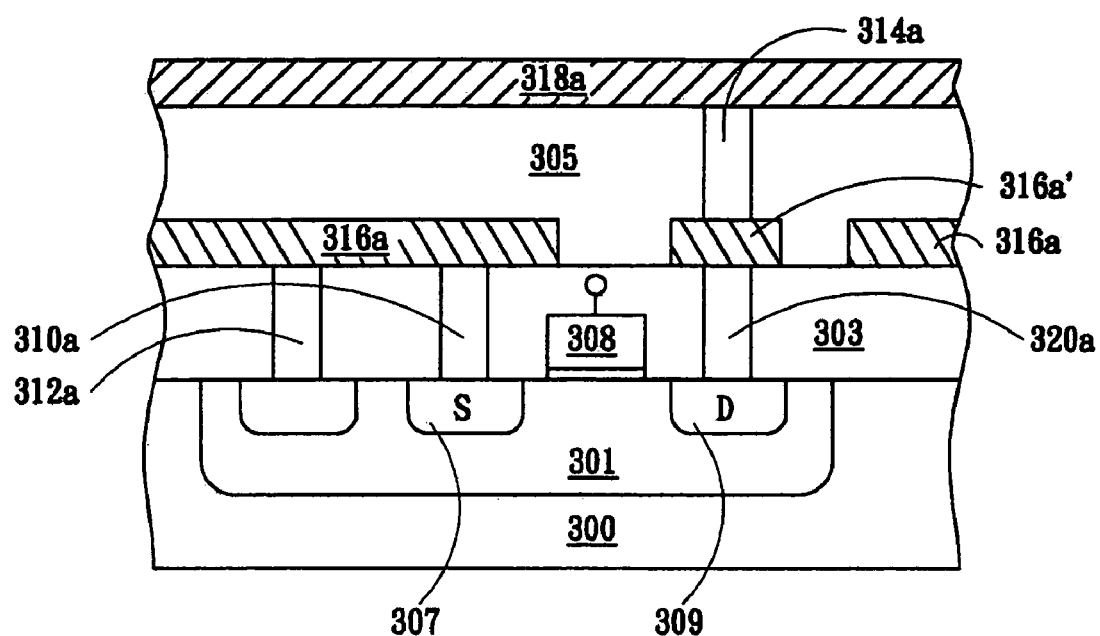
FIG. 3B shows a simplified cross sectional view of two adjacent source and drain regions in the lattice pattern.

Referring to FIG. 3, a schematic diagram of one embodiment of a power metal oxide semiconductor (MOS) transistor layout of the invention is shown. The power MOS transistor layout comprises areas 302, 304 and 306. The power MOS transistor layout of the invention uses a network of conductive lead line and a conductive plane as the interconnection between the source and drain of the power MOS transistor layout. Referring to FIG. 3A, a top view of a portion of the area 302 is shown. The power MOS transistor layout comprises a polysilicon gate 308 with a square lattice pattern, source regions and drain regions. Each source region is laid to be surrounded by four drain regions and each drain region is laid in a similar manner. In the area 302, the power MOS transistor layout uses a network of conductive lead line 316a as the interconnection of the source regions and the well pickup contacts and a conductive plane 318a as the interconnection of the drain regions. The network of conductive lead line 316a is used as the interconnection of source contacts 310a and well pickup contacts 312a. The conductive plane 318a is used as the interconnection of drain contacts 320a and vias 314a. FIG. 3B shows a simplified cross sectional view of two adjacent source and drain regions in the lattice pattern in which several elements are omitted to further explain the layout shown in FIG. 3A. FIG. 3B shows that the conductive plane 318a is formed above the network of conductive lead line 316a and completely covers the area 302. The conductive plane 318a connects conductive lead line 316a' which is formed together with the conductive lead line 316a above the drain regions 309 through vias 314a so as to connect the drain regions 309 through drain contacts 320a. The conductive lead line 316a' dose not connect to the conductive lead line 316a. Moreover, the conductive lead line 316a connects source regions 307 through the source contacts 310a and connects well regions 301 via the well pickup contacts 312a. FIG. 3B also shows substrate 300, gate electrode 308, a gate dielectric layer under the gate electrode 308 and dielectric layers 303 and 305. In the layout shown in FIG. 3A, the power MOS transistor layout has a fully well pickup structure. It is noted that the allocation of the well pickup contacts shown in FIG. 3A is just an example, not a limitation. The well pickup contact is not necessary present aside every source contact. The network of conductive lead line has two-direction line extension constituting a connection network and the conductive plane has a plane conductive connection of the source and drain regions instead of conventional single direction connections or line connections thereby achieves a high uniformity of current. This feature is particularly important for a power MOS transistor which is used to provide a large current to drive a chip or device since a low on-resistance of source-to-drain (Rds_on) is particularly required in order to decrease power loss as less as possible when a low on-voltage of source-to-drain is applied. These advantages of low Rds_on, high current uniformity and much less power loss are presented in both the network of conductive lead line 316a and the conductive plane 318a. Moreover, since the actual line density of the conductive lead line of the network is two times larger than that of conventional layouts, the resistance to electron migration is therefore strengthened, and the Rds_on is also much smaller than that of conventional layouts.

Figure 3C:
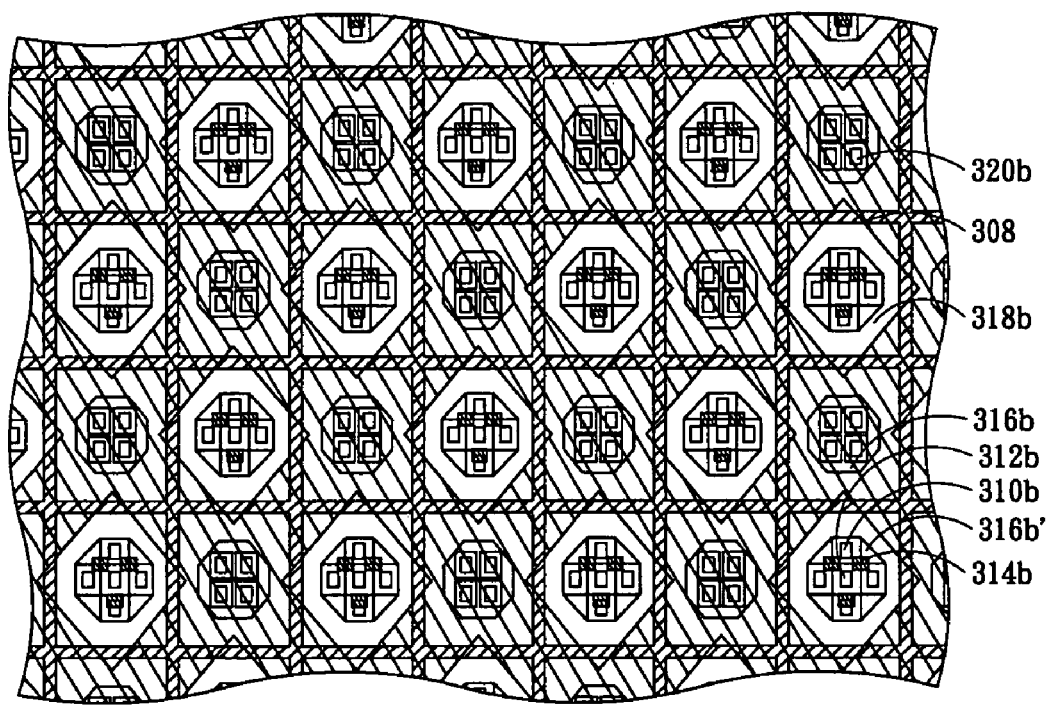
FIG. 3C shows a detail top view of a portion of the power MOS transistor layout of the invention.
Figure 3D:
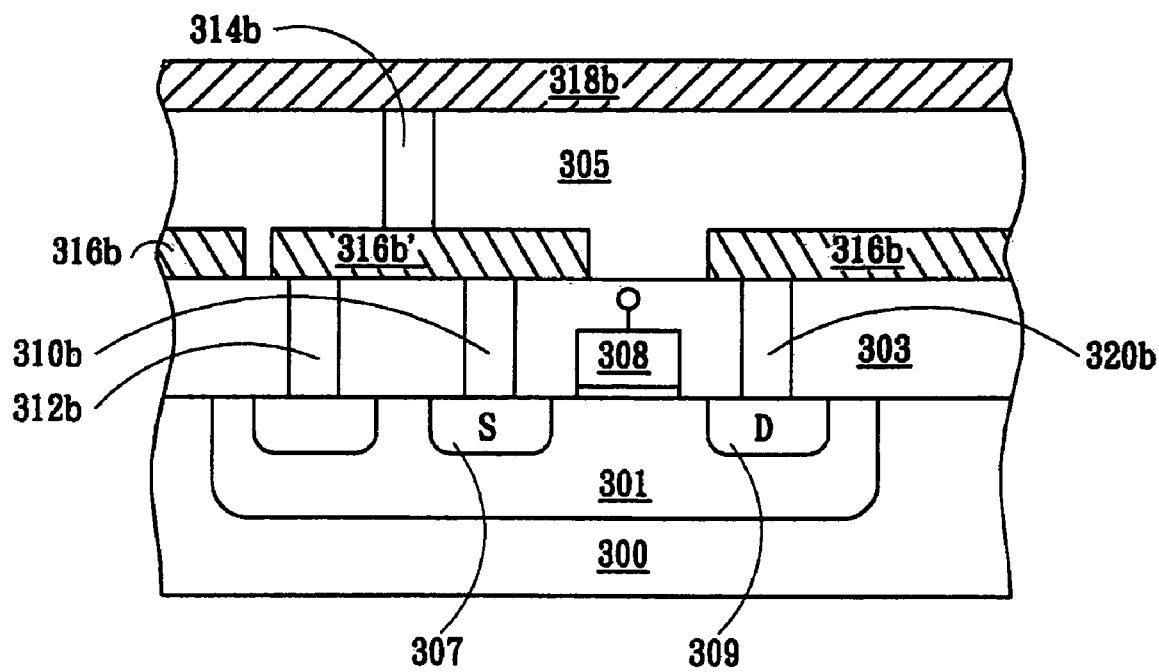
FIG. 3D shows a simplified cross sectional view of two adjacent source and drain regions in the lattice pattern.

Referring to FIG. 3C, a top view of a portion of the area 304 is shown. In the area 304, the power MOS transistor layout uses a network of conductive lead line 316b comprising as the interconnection of the drain regions, and a conductive plane 318b as the interconnection of the source regions and the well pickup contacts. Particularly, the network of conductive lead line 316b is particularly used as the interconnection of drain contacts 320b. The conductive plane 318b is particularly used as the interconnection of source contacts 310b, well pickup contacts 312b and vias 314*b*. The polysilicon gate 308 with a square lattice pattern, the source regions and drain regions of the power MOS transistor layout in the area 304 is similar to that of the power MOS transistor layout in the area 302. FIG. 3D shows a simplified cross sectional view of two adjacent source and drain regions in the lattice pattern in which several elements are omitted to further explain the layout shown in FIG. 3C. FIG. 3D shows that the conductive plane 318*b* is formed above the network of conductive lead line 316*b* and completely covers the area 304. The conductive plane 318*b* connects conductive lead line 316*b*' which is formed together with the conductive lead line 316*b* above the source regions 307 through vias 314*b* so as to connect the source regions 307 through source contacts 310*b*, and connect the well regions 301 through the well pickup contacts 312*b*. Moreover, the conductive lead line 316*b* connects the drain regions 309 through the drain contacts 320*b*. FIG. 3D also shows the substrate 300, the gate electrode 308, the gate dielectric layer under the gate electrode 308 and the dielectric layers 303 and 305. Each source region is laid to be surrounded by four drain regions and each drain region is laid in a similar manner. The network of conductive lead line 316*b* has a two-direction line extension constituting a connection network and the conductive plane 318*b* has a plane conductive connection of the source, well and drain regions instead of conventional single direction connections or line connections thereby achieves a high uniformity of current. Unlike the network of conductive lead line 316*a* and the conductive plane 318*a* in the area 302, the network of conductive lead line 316*b* is used as the interconnection of the drain regions, and the conductive plane 318*b* is used as the interconnection of the source regions and the well pickup contacts. Nevertheless, the advantages of low Rds_on, high current uniformity and much less power loss which are presented in the network of conductive lead line 316*a* and the conductive plane 318*a* in the area 302 are also existed in the network of conductive lead line 316*b* and the conductive plane 318*b* in the area 304. The actual line density of the conductive lead line of this network is about two times larger than that of conventional layouts and the resistance to electron migration is therefore strengthened, and the Rds_on is also much smaller than that of conventional layouts.

Figure 3E:
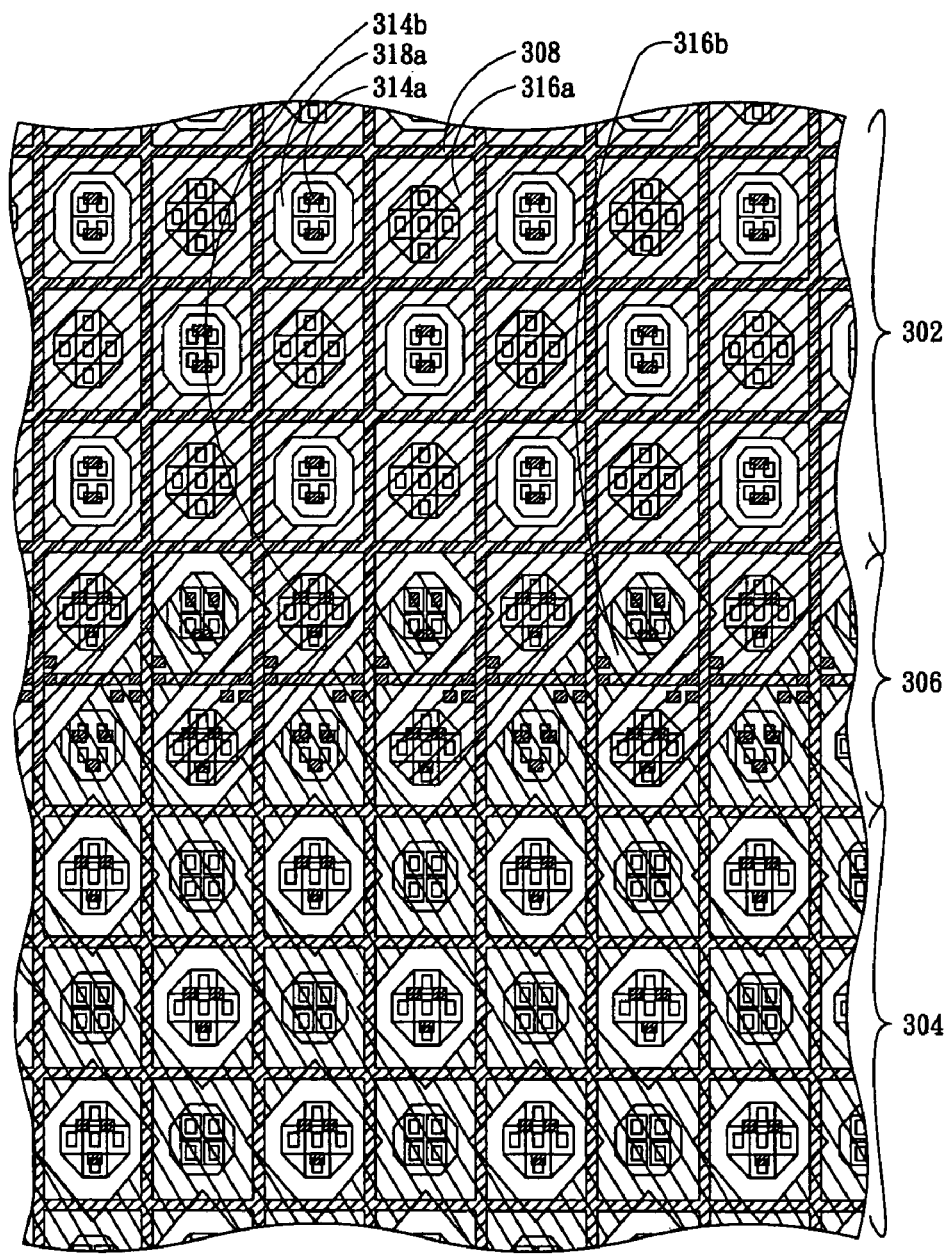
FIG. 3E shows a detail top view of the portions shown in FIGS. 3A and 3C as well as the interconnection portion therebetween of the power MOS transistor layout of the invention.
Figure 3F:
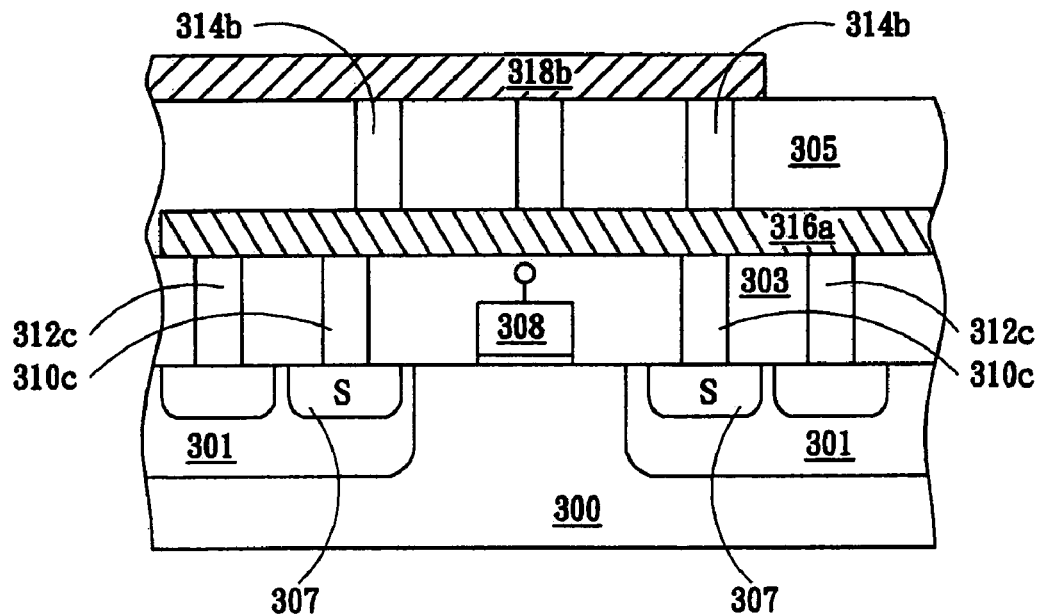
FIG. 3F shows a simplified cross sectional view along the diagonal of one source region in FIG. 3E.

Referring to FIG. 3E, a top view of portions of the areas 302, 304 and 306 is shown. In the layout shown in FIGS. 3 and 3A–3E, the network of conductive lead line 316*a* of the area 302 connects to the conductive plane 318*b* of the area 304, and the network of conductive lead line 316*b* of the area 304 connects to the conductive plane 318*a* of the area 302. FIG. 3F shows a simplified cross sectional view along the diagonal of one source region in the area 306 in which several elements are omitted to further explain the layout shown in FIG. 3E. FIG. 3F shows that the network of conductive lead line 316*a* in the area 302 connects the conductive plane 318*b* in the area 304 through the vias 314*b*. The network of conductive lead line 316*a* in the area 302 extends to the area 306 and connects the source regions 307 and well regions 301. The conductive lead line 316*a* connects the source regions 307 and well regions 301 in the area 302 through the source contacts 310*a* and the well pickup contacts 312*a*, and connects the source regions 307 and well regions 301 in the area 306 through the source contacts 310*c* and the well pickup contacts 312*c*. The conductive lead line 316*a* connects the conductive plane 318*b* in the area 304 through vias 314*b* so as to connect the source regions 307 and well regions 301 in the area 304. FIG. 3F also shows the substrate 300, the gate electrode 308, the gate dielectric layer under the gate electrode 308 and the dielectric layers 303 and 305.

Figure 3G:
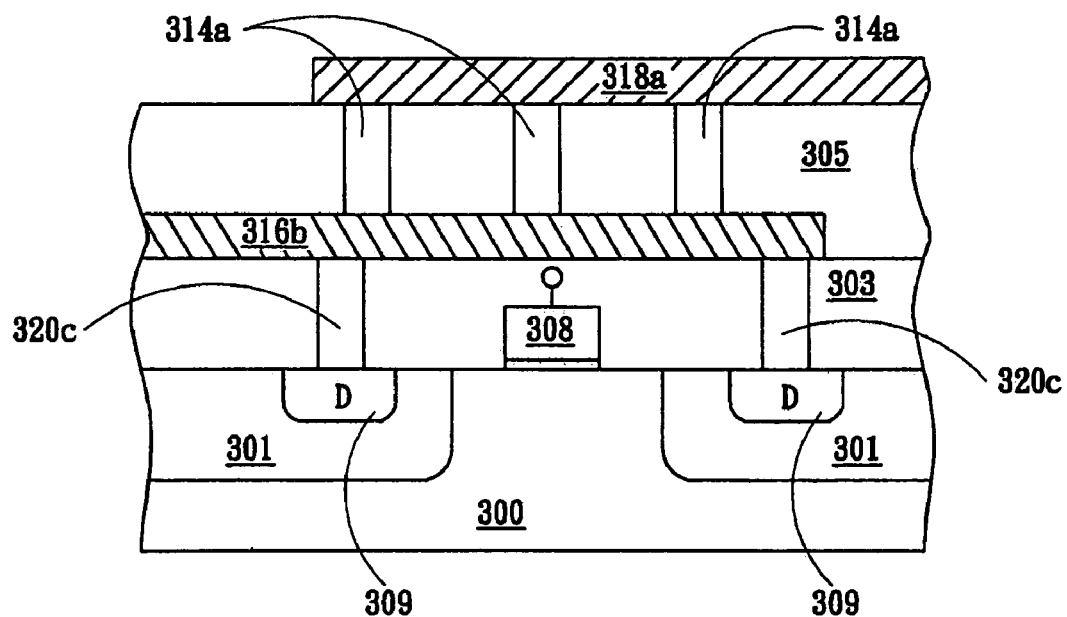
FIG. 3G shows a simplified cross sectional view along the diagonal of one drain region in FIG. 3E.

FIG. 3G shows a simplified cross sectional view along the diagonal of one drain region in the area 306 in which several elements are omitted to further explain the layout shown in FIG. 3E. FIG. 3G shows that the network of conductive lead line 316*b* in the area 304 connects the conductive plane 318*a* in the area 302 through the vias 314*a*. The network of conductive lead line 316*b* in the area 304 extends to the area 306 and connects the drain regions 309. The conductive lead line 316*b* connects the drain regions 309 in the area 304 through the drain contacts 320*b*, and connects the drain regions 309 in the area 306 through the drain contacts 320*c*. The conductive lead line 316*b* connects the conductive plane 318*a* in the area 302 through via 314*a* so as to connect the drain regions 309 in the area 302. FIG. 3G also shows the substrate 300, the gate electrode 308, the gate dielectric layer under the gate electrode 308 and the dielectric layers 303 and 305. In the area 306, the conductive lead line 316*b* connects to the conductive plane 318*a* in the area 302 in an interlace manner with the conductive lead line 316*a* as the interconnection between the drain regions in the areas 302 and 304 respectively. The network connection and the conductive plane connections of the source and drain regions in both areas 302 and 304 further enhance the advantages of low Rds_on, high current uniformity, less power loss and strengthened electron migration resistance.

Figure 4:
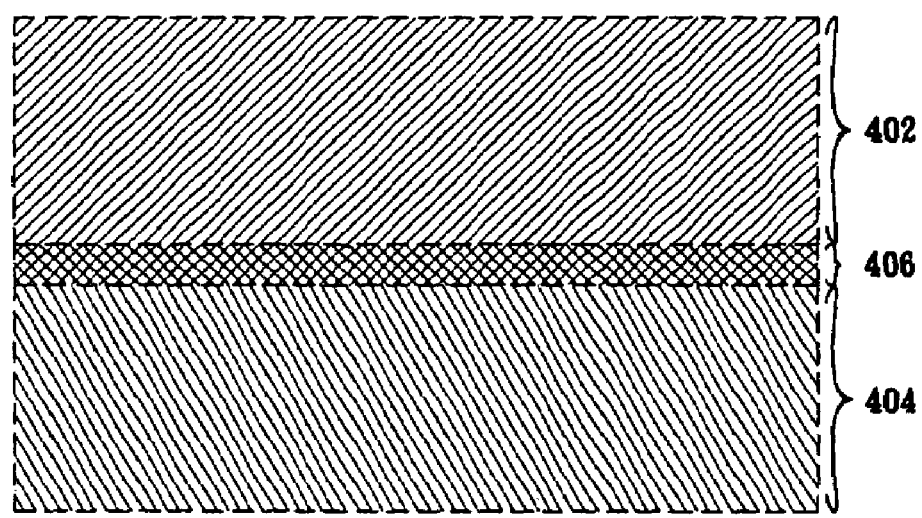
FIG. 4 shows a schematic diagram of another embodiment of a power MOS transistor layout of the invention.
Figure 4A:
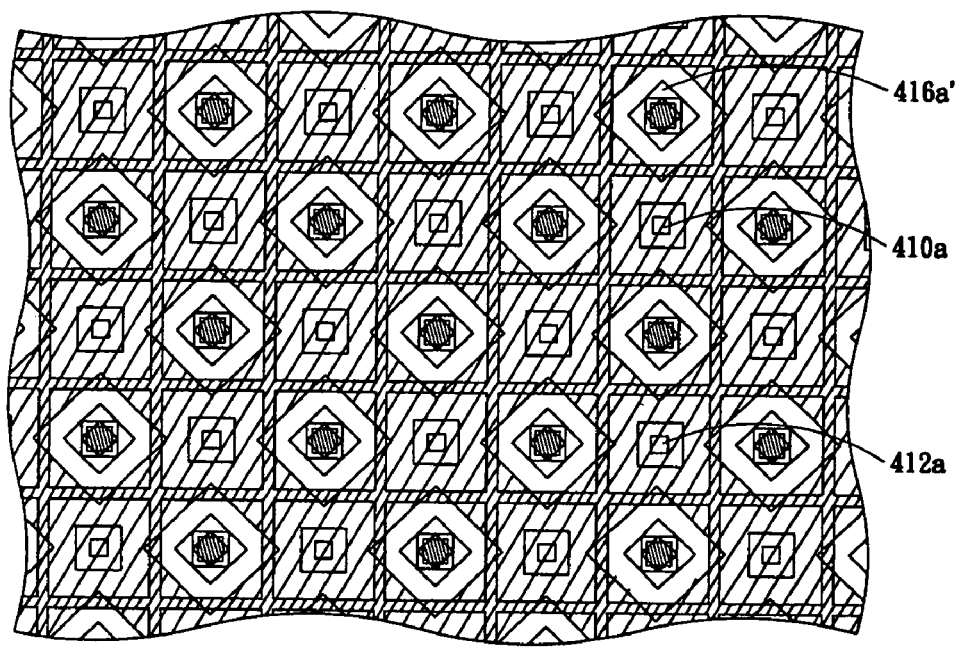
FIG. 4A shows a detail top view of a portion of the power MOS transistor layout of the invention.
Figure 4B:
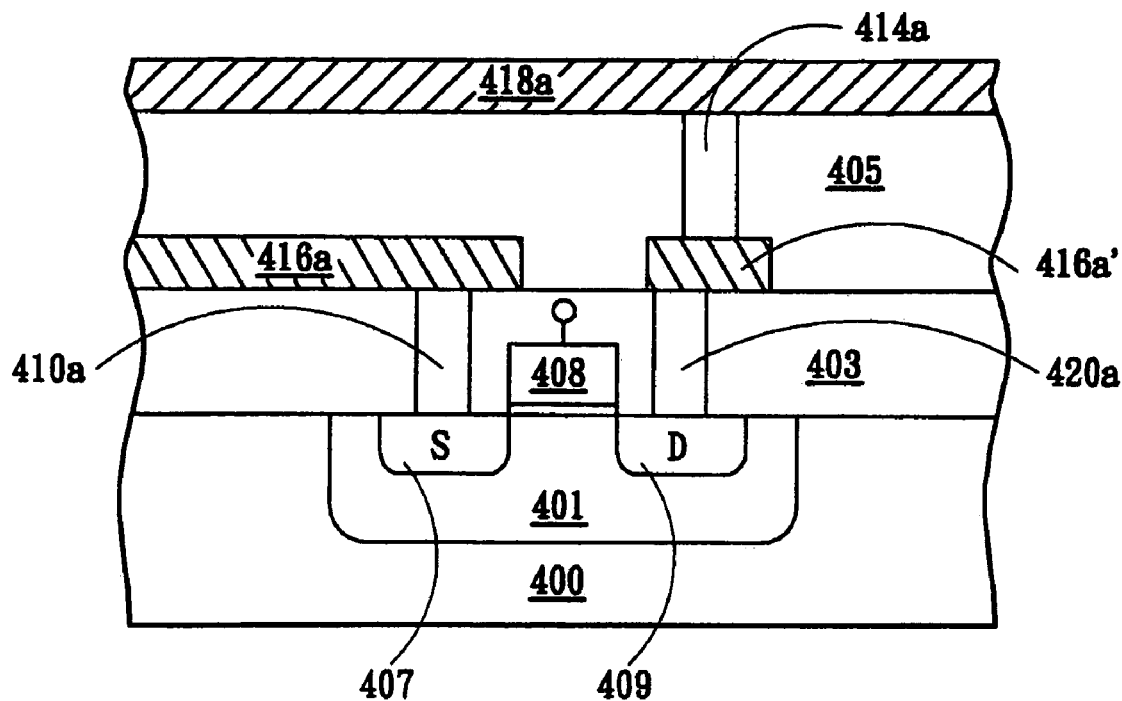
FIG. 4B shows a simplified cross sectional view of two adjacent source and drain regions in the lattice pattern.
Figure 4C:
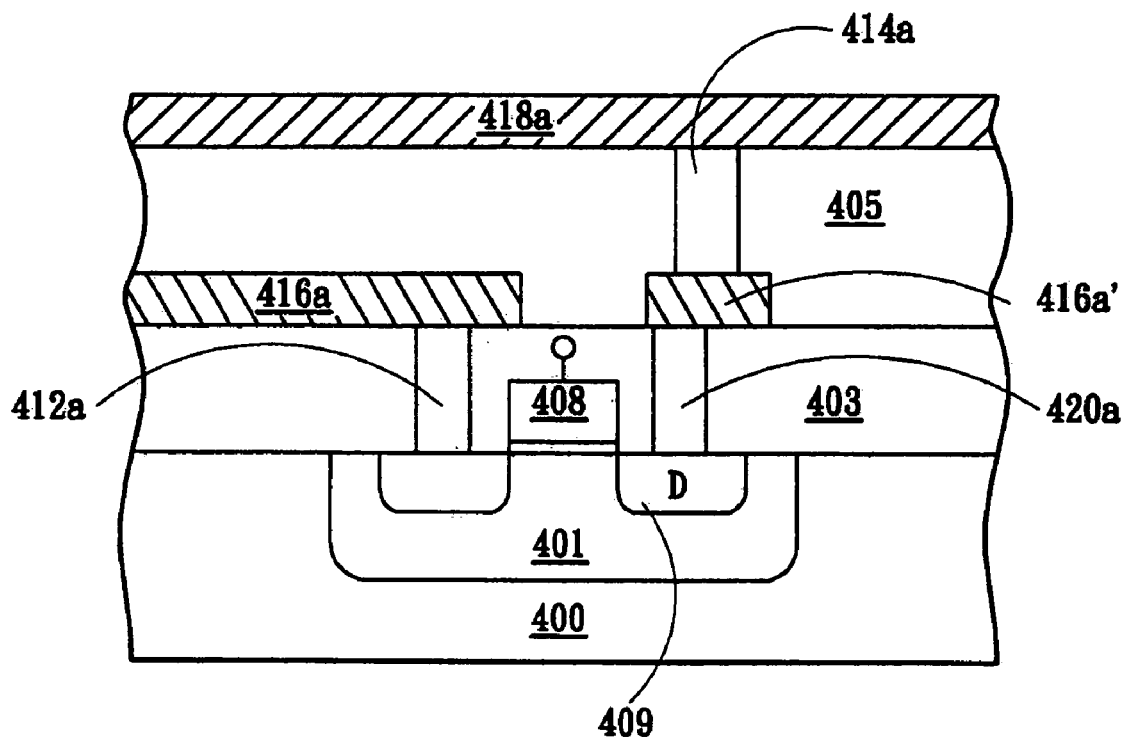
FIG. 4C shows a simplified cross sectional view of two adjacent well and drain regions in the lattice pattern

Referring to FIG. 4, a schematic diagram of another embodiment of a power MOS transistor layout of the invention is shown. The power MOS transistor layout has areas 402, 404 and 406. Referring to FIG. 4A, a top view of a portion of the area 402 is shown. The power MOS transistor layout comprises a gate 408 with a square lattice pattern, well regions, source regions and drain regions. In the area 402, the power MOS transistor layout uses a network of conductive lead line 416*a* as the interconnection of the source regions and the well pickup contacts 412*a* and a conductive plane 418*a* as the interconnection of the drain regions and vias 414*a*. FIG. 4B shows a simplified cross sectional view of two adjacent source and drain regions in the lattice pattern in which several elements are omitted to further explain the layout shown in FIG. 4A. FIG. 4B shows that the conductive plane 418*a* is formed above the network of conductive lead line 416*a* and completely covers the area 402. The conductive plane 418*a* connects conductive lead line 416*a*' which is formed together with the conductive lead line 416*a* above the drain regions 409 through vias 414*a* so as to connect the drain regions 409 through drain contacts 420*a*. The conductive lead line 416*a*' dose not connect to the conductive lead line 416*a*. Moreover, the conductive lead line 416*a* connects source regions 407 through the source contacts 410*a*. FIG. 4B also shows substrate 400, gate electrode 408, a gate dielectric layer under the gate electrode 408 and dielectric layers 403 and 405. FIG. 4C shows a simplified cross sectional view of two adjacent well and drain regions in the lattice pattern in which several elements are omitted to further explain the layout shown in FIG. 4A. FIG. 4C shows that the conductive plane 418*a* is formed above the network of conductive lead line 416*a* and completely covers the area 402. The conductive plane 418*a* connects conductive lead line 416*a*' above the drain regions 409 through vias 414*a* so as to connect the drain regions 409 through drain contacts 420*a*. Moreover, the conductive lead line 416*a* connects well regions 401 through the well pickup contacts 412*a*. FIG. 4C also shows substrate 400, gate electrode 408, a gate dielectric layer under the gate electrode 408 and dielectric layers 403 and 405. The network of conductive lead line 416a is used as the interconnection between the source contacts 410a and the well pickup contacts 412a. The conductive plane 418a is used as the interconnection between the drain contacts and the vias 414a. In the layout shown in FIG. 4A, the power MOS transistor layout is for a partial well pickup structure. It is noted that the allocation of the well pickup contacts 412a shown in FIG. 4A is just an example, not a limitation. The network of conductive lead line has two-direction line extension constituting a connection network or a plane conductive connection of the source, well and drain regions thereby achieves a high uniformity of current which is crucial for a power MOS transistor which provides a large current to drive a chip. Moreover, since the current is mainly used to drive the chip, not dissipate in the connection lines, thus a low on-resistance of source-to-drain (Rds_on) is particularly required in order to decrease power loss as less as possible when a low on-voltage of source-to-drain is applied. These advantages of low Rds_on, high current uniformity and much less power loss are presented in both the network of conductive lead line 416a and the conductive plane 418a. Moreover, since the actual line density of the conductive lead line of the network is two times larger than that of conventional layouts and the resistance to electron migration is therefore strengthened, the Rds_on is also much smaller than that of conventional layouts.

Figure 4D:
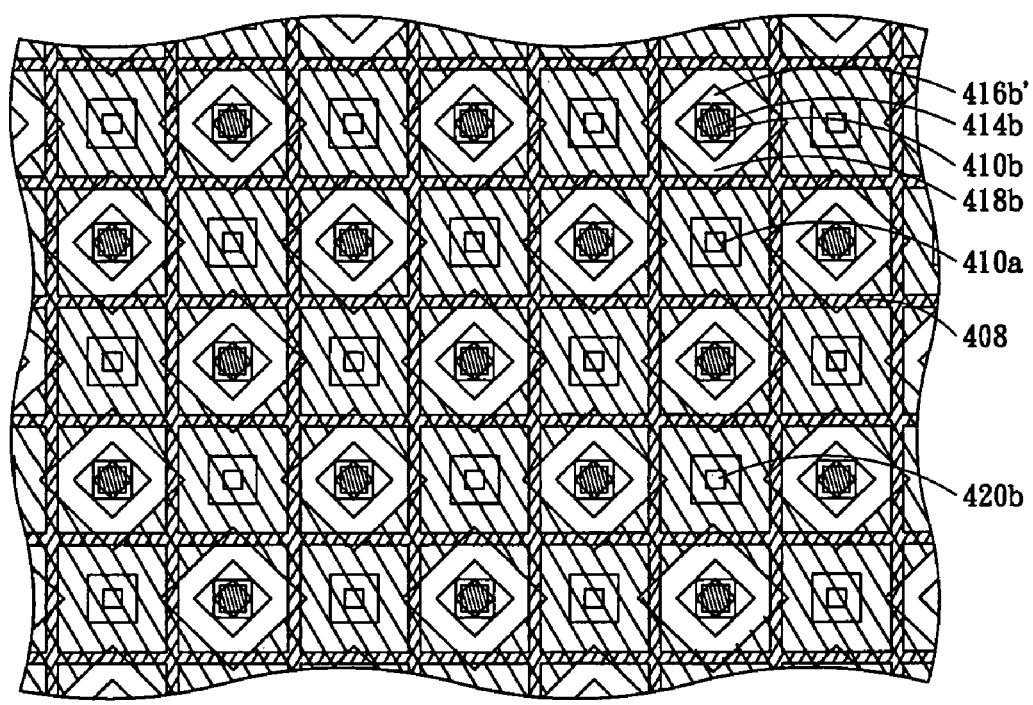
FIG. 4D shows a detail top view of another portion of the power MOS transistor layout of the invention.

Referring to FIG. 4D, a top view of a portion of the area 404 is shown. In the area 404, the power MOS transistor layout uses a network of conductive lead line 416b as the interconnection of the drain regions and a conductive plane 418b as the interconnection of the source regions and the well pickup contacts. Particularly, the network of conductive lead line 416b is particularly used as the interconnection line of drain contacts 420b. The conductive plane 418b is particularly used as the interconnection of the source contacts 410b, the well pickup contacts 412b and vias 414b. The gate 408 with a square lattice pattern, the source regions and drain regions of the power MOS transistor layout in the area 404 is similar to that of the power MOS transistor layout in the area 402.

Figure 4E:
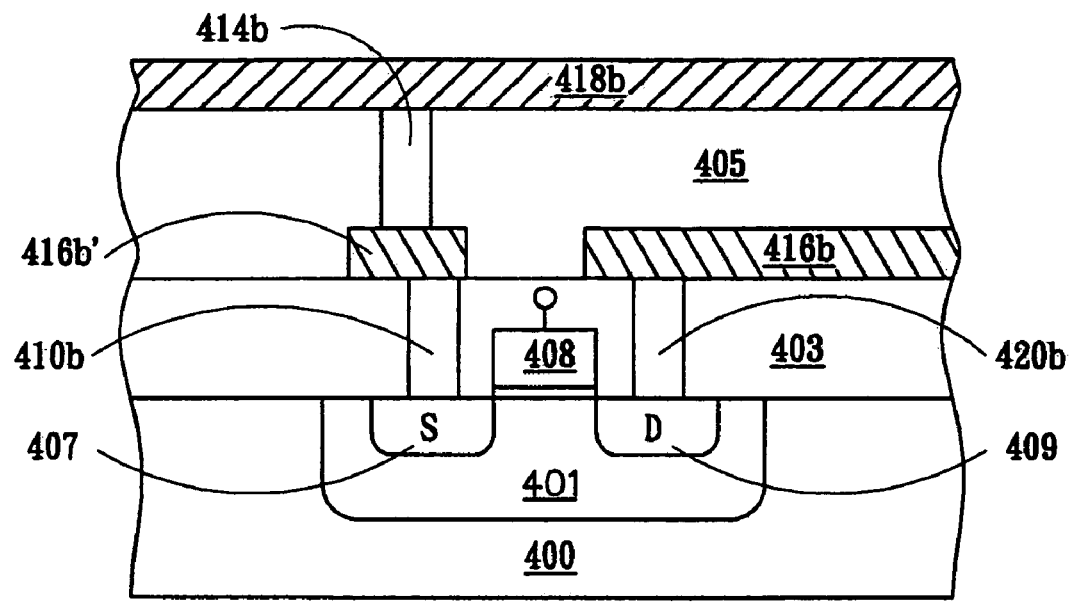
FIG. 4E shows a simplified cross sectional view of two adjacent source and drain regions in the lattice pattern.

FIG. 4E shows a simplified cross sectional view of two adjacent source and drain regions in the lattice pattern in which several elements are omitted to further explain the layout shown in FIG. 4D. FIG. 4E shows that the conductive plane 418b is formed above the network of conductive lead line 416b and completely covers the area 404. The conductive plane 418b connects conductive lead line 416b' which is formed together with the conductive lead line 416b above the source regions 407 through vias 414b so as to connect the source regions 407 through source contacts 410b. The conductive lead line 416b' dose not connect to the conductive lead line 416b. Moreover, the conductive lead line 416b connects drain regions 409 through the drain contacts 420b. FIG. 4E also shows substrate 400, gate electrode 408, a gate dielectric layer under the gate electrode 408 and dielectric layers 403 and 405.

Figure 4F:
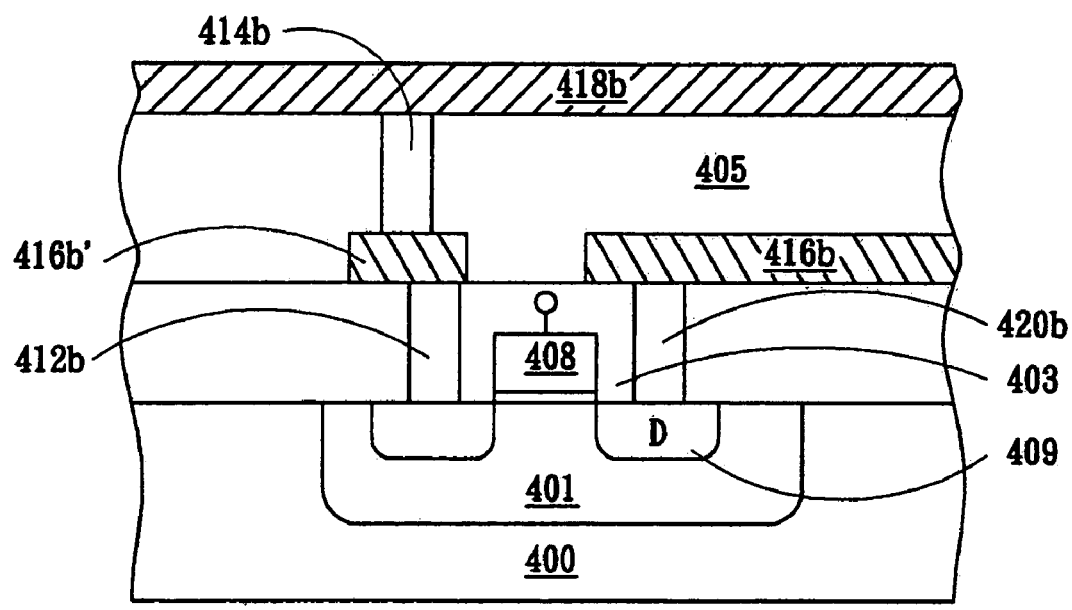
FIG. 4F shows a simplified cross sectional view of two adjacent well and drain regions in the lattice pattern.

FIG. 4F shows a simplified cross sectional view of two adjacent well and drain regions in the lattice pattern in which several elements are omitted to further explain the layout shown in FIG. 4D. FIG. 4F shows that the conductive plane 418b is formed above the network of conductive lead line 416b and completely covers the area 404. The conductive plane 418b connects conductive lead line 416b' above the well regions 401 through vias 414b so as to connect the well regions 401 through well pickup contacts 412b. Moreover, the conductive lead line 416b connects drain regions 409 through the drain contacts 420b. FIG. 4F also shows substrate 400, gate electrode 408, a gate dielectric layer under the gate electrode 408 and dielectric layers 403 and 405. The network of conductive lead line 416b is used as the interconnection of the drain contacts 420b. The conductive plane 418b is used as the interconnection between the source contacts 410b and the well pickup contacts 412b through the vias 414b. The network of conductive lead line 416b and the conductive plane 418b have two-direction line extension constituting a connection network and a plane conductive connection of the source, well and drain regions instead of conventional single direction connections or line connections thereby achieves a high uniformity of current. The network of conductive lead line 416b is used as the interconnection of the drain regions, and the conductive plane 418b is used as the interconnect of the source regions and the well pickup contacts. This connection network and the plane conductive connection have advantages of low Rds_on, high current uniformity and much less power loss. The actual line density of this network is about two times larger than that of conventional layouts and the resistance to electron migration is therefore strengthened, the Rds_on is also much smaller than that of conventional layouts.

Figure 4G:
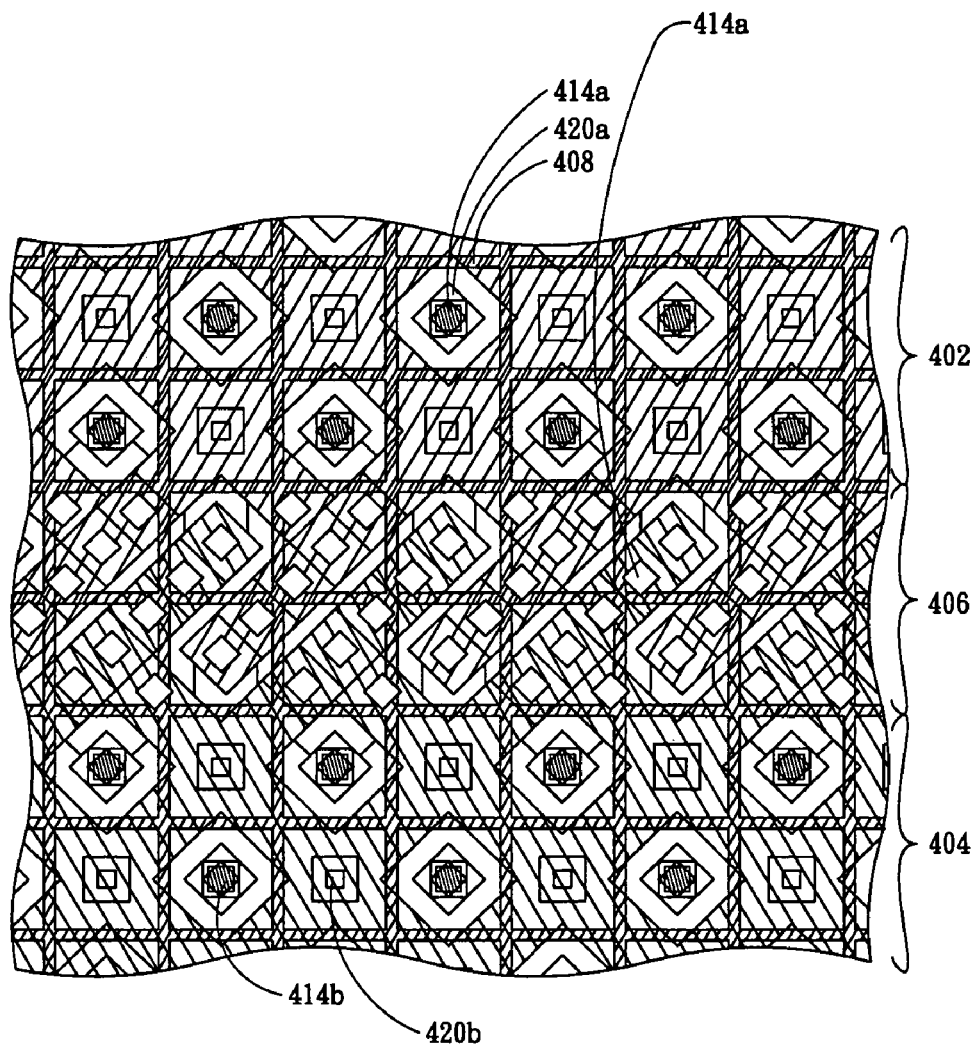
FIG. 4G shows a detail top view of the portions shown in FIGS. 4A and 4D as well as the interconnection portion therebetween of the power MOS transistor layout of the invention.
Figure 4H:
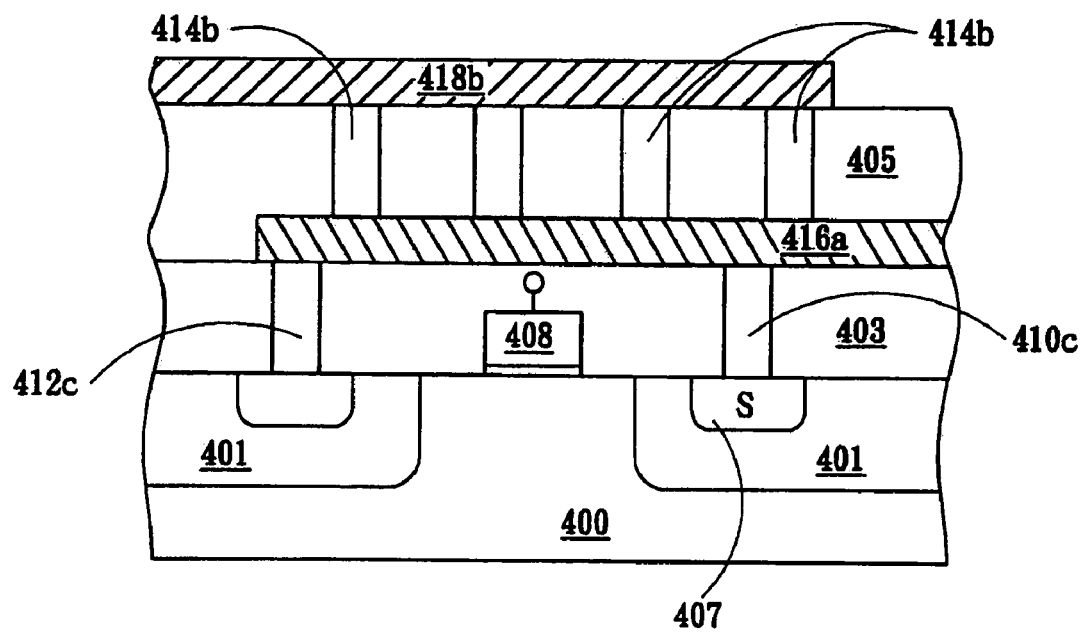
FIG. 4H shows a simplified cross sectional view along the diagonal of one source region and one well region.

Referring to FIG. 4G, a top view of portions of the areas 402, 404 and 406 is shown. In the layout shown in FIG. 4G, the network of conductive lead line 416a of the area 402 connects to the conductive plane 418b of the area 404 by vias 414b, and the network of conductive lead line 416b of the area 404 connects to the conductive plane 418a of the area 402 by vias 414a. FIG. 4H shows a simplified cross sectional view along the diagonal of one source region and one well region in the area 406 in which several elements are omitted to further explain the layout shown in FIG. 4G. FIG. 4H shows that in the area 406 the network of conductive lead line 416a in the area 402 connects the conductive plane 418b in the area 404 through the vias 414b. The network of conductive lead line 416a in the area 402 extends to the area 404 and connects the source regions 407 and the well regions 401. The conductive lead line 416a connects the source regions 407 through the source contacts 410c, and connects the well regions 401 through the well pickup contacts 412c in the area 406. The conductive lead line 416a connects the conductive plane 418b in the area 404 through the vias 414b so as to connect the source regions 407 and the well regions 401 in the area 404. FIG. 4H also shows the substrate 400, the gate electrode 408, the gate dielectric layer under the gate electrode 408 and the dielectric layers 403 and 405. In the area 406, the conductive lead line 416b connects to the conductive plane 418a in the area 402 in an interlace manner with the conductive lead line 416a as the interconnection between the drain regions in the areas 402 and 404 respectively. The network connection and the conductive plane connections of the source and drain regions in both areas 402 and 404 further enhance the advantages of low Rds_on, high current uniformity, less power loss and strengthened electron migration resistance.

Figure 4I:
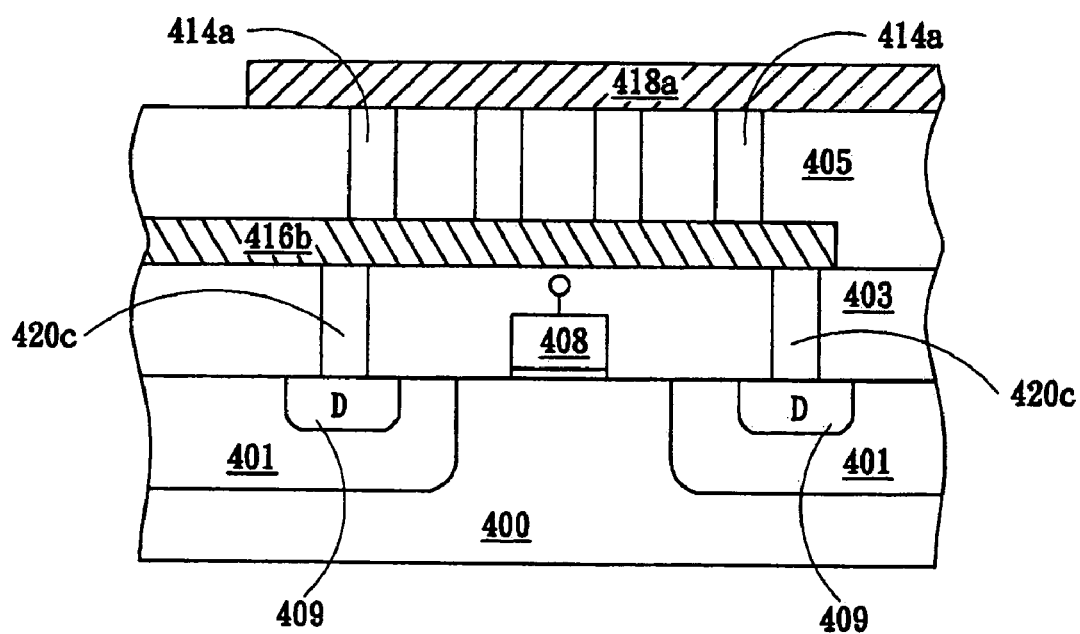
FIG. 4I shows a simplified cross sectional view along the diagonal of one drain region.

FIG. 4I shows a simplified cross sectional view along the diagonal of one drain region in the area 406 in which several elements are omitted to further explain the layout shown in FIG. 4G. FIG. 4I shows that in the area 406 the network of conductive lead line 416b in the area 404 connects the conductive plane 418a in the area 402 through the vias 414a. The network of conductive lead line 416b in the area 404 extends to the area 406 and connects the drain regions 409. The conductive lead line 416b connects the drain regions 409 in the area 404 through the drain contacts 420b, and connects the drain regions 409 in the area 406 through the drain contacts 420c. The conductive lead line 416b connects the conductive plane 418a in the area 406 through via 414a so as to connect the drain regions 409 in the area 402. FIG. 4I also shows the substrate 400, the gate electrode 408, the gate dielectric layer under the gate electrode 408 and the dielectric layers 403 and 405. The network connection and the conductive plane connections of the source and drain regions in both areas 402 and 404 further enhance the advantages of low Rds_on, high current uniformity, less power loss and strengthened electron migration resistance.

Figure 5:
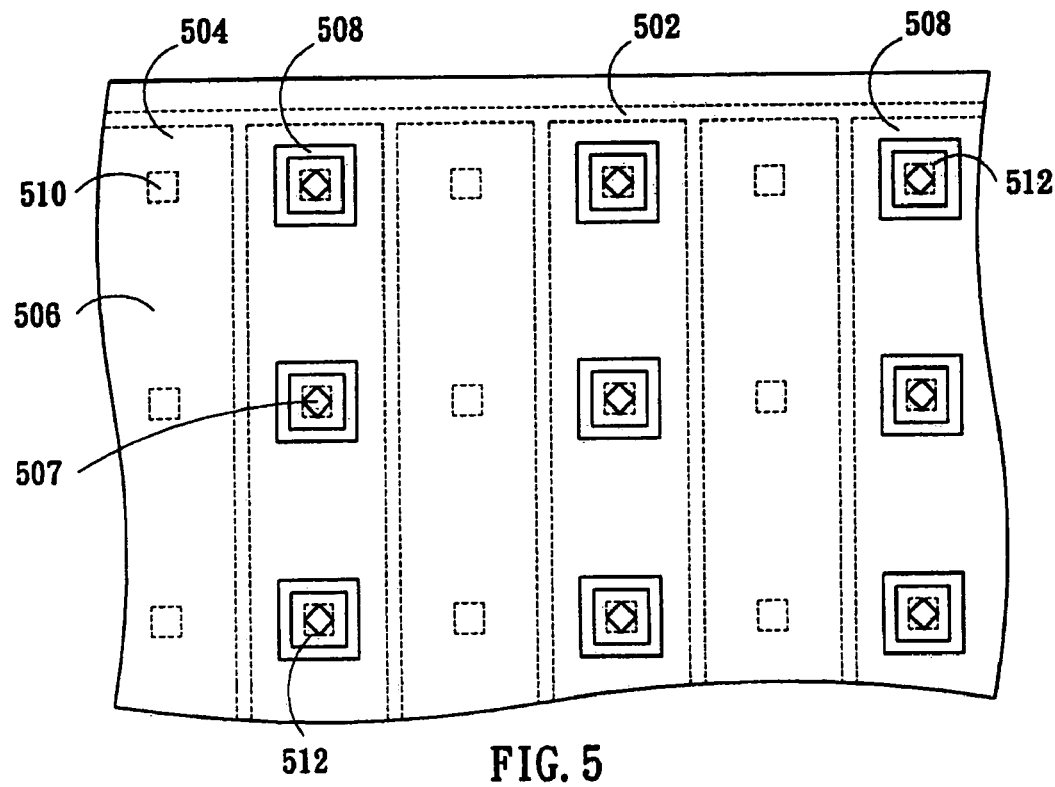
FIGS. 5 and 6 show two embodiments of network layouts of the power MOS transistor layout of the invention respectively.
Figure 6:
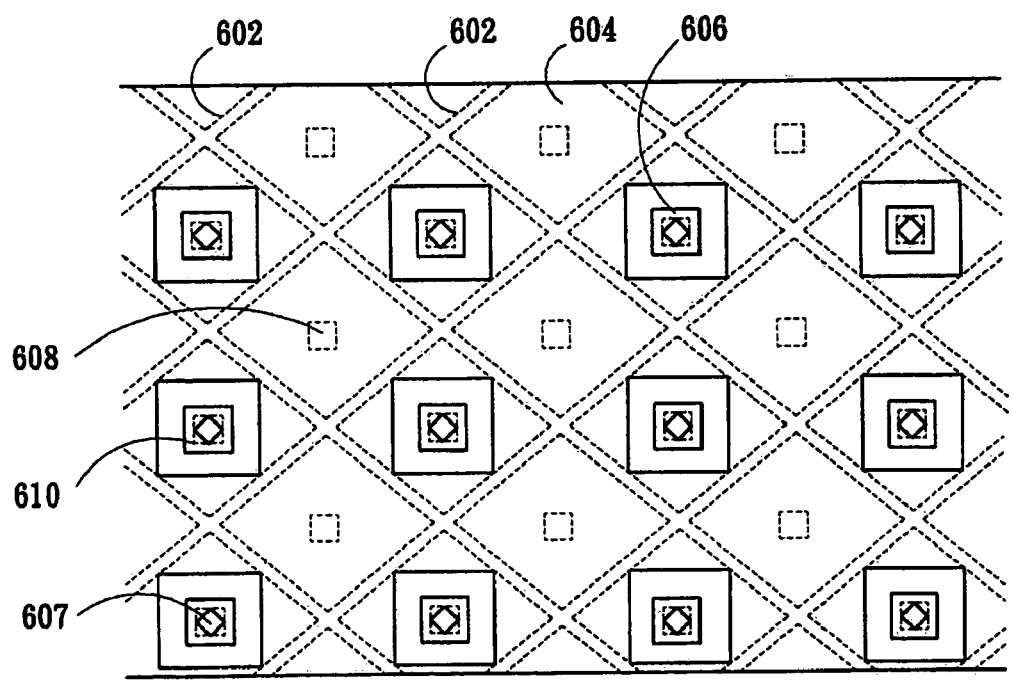

FIGS. 5 and 6 show other two embodiments of network layouts of the power MOS transistor layout of the invention. Referring to FIG. 5, a top view of a portion of the network layout is shown. The power MOS transistor layout comprises a gate electrode 502 with a strip grating pattern, source region 504 and drain region. Each source region is laid to be adjacent a drain region in an interlace manner. The power MOS transistor layout uses a network of conductive lead line 506 as the interconnection of the source region 504 and a conductive plane 508 as the interconnection of the drain region through vias 507. The network of conductive lead line 506 is used as the interconnection of source contacts 510. The conductive plane 508 is used as the interconnection of drain contacts 512. The network of conductive lead line has two-direction line extension constituting a connection network or a plane conductive connection of the source and drain region thereby achieves a high uniformity of current, low Rds_on, much less power loss, an actual line density two times larger than that of conventional layouts and a strengthened resistance to electron migration.

Referring to FIG. 6 a top view of a portion of another network layout is shown. The network layout of the power MOS transistor comprises a gate electrode 602 with a rhombus pattern, source regions and drain regions. Each source region is laid to be surrounded by four drain regions and each drain region is laid in a similar manner. The square lattice or strip grating or rhombus lattice pattern of the polysilicon gates shown in FIGS. 3A–3G, 4A–4I, 5 and 6 respectively are examples only. Other geometrical shape such as a rectangle lattice pattern and an octagon lattice pattern can also be used. In this embodiment, the network layout of the power MOS transistor layout uses a network of conductive lead line 604 as the interconnection of the source regions and a conductive plane 606 as the interconnection of the drain regions through vias 607. More precisely, the network of conductive lead line 604 is used as the interconnection of source contacts 608. The conductive plane 606 is used as the interconnection of drain contacts 610. The network of conductive lead line also has two-direction line extension constituting a connection network or a plane conductive connection of the source and drain region thereby achieves a high uniformity of current, low Rds_on, much less power loss, an actual line density two times larger than that of conventional layouts and a strengthened resistance to electron migration.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A power metal oxide semiconductor transistor layout comprising:
   a gate electrode with a lattice pattern on a substrate having a first area and a second area;
   a plurality of source regions laid in said lattice pattern;
   a plurality of drain regions laid in said lattice pattern, each said source region is laid to be surrounded by said drain regions;
   a first meshwork of conductive lead connecting said source regions on said first area;
   a second conductive plane connecting said drain regions on said first area and over said first meshwork of conductive lead and said first area;
   a third meshwork of conductive lead connecting said drain regions on said second area; and
   a fourth conductive plane connecting said source regions on said second area and over said third meshwork of conductive lead and said second area, said first meshwork of conductive lead connects said fourth conductive plane, and said second conductive plane connects said third meshwork of conductive lead.

2. The power metal oxide semiconductor transistor layout according to claim 1, wherein said lattice pattern comprises a square lattice pattern.

3. The power metal oxide semiconductor transistor layout according to claim 1, wherein said lattice pattern comprises a rectangle lattice pattern.

4. The power metal oxide semiconductor transistor layout according to claim 1, wherein said lattice pattern comprises a rhombus lattice pattern.

5. The power metal oxide semiconductor transistor layout according to claim 1, wherein said lattice pattern comprises an octagon lattice pattern.

6. The power metal oxide semiconductor transistor layout according to claim 1, wherein said first meshwork of conductive lead connects source contacts and well pickup contacts in said first area.

7. The power metal oxide semiconductor transistor layout according to claim 1, wherein said second conductive plane connects drain contacts in said first area.

8. The power metal oxide semiconductor transistor layout according to claim 1, wherein said third meshwork of conductive lead connects drain contacts in said second area.

9. The power metal oxide semiconductor transistor layout according to claim 1, wherein said fourth conductive plane connects source contacts and well pickup contacts in said second area.

10. A power metal oxide semiconductor transistor layout comprising:
    a gate electrode with a strip grating pattern on a substrate having a first area and a second area;
    a plurality of source regions laid in said strip grating pattern;
    a plurality of drain regions laid in said strip grating pattern, each said drain region is surrounded by said source regions;
    a first meshwork of conductive lead connecting said source regions on said first area;
    a second conductive plane connecting said drain regions on said first area and over said first meshwork of conductive lead and said first area;
    a third meshwork of conductive lead connecting said drain regions on said second area; and
    a fourth conductive plane connecting said source regions on said second area and over said third meshwork of conductive lead and said second area, said first meshwork of conductive lead connects said fourth conductive plane, and said second conductive plane connects said third meshwork of conductive lead.

11. The power metal oxide semiconductor transistor layout according to claim 10, wherein said first meshwork of conductive lead connects source contacts and well pickup contacts in said first area.

12. The power metal oxide semiconductor transistor layout according to claim 10, wherein said second conductive plane connects drain contacts in said first area.

13. The power metal oxide semiconductor transistor layout according to claim 1, wherein said third meshwork of conductive lead connects drain contacts in said second area.

14. The power metal oxide semiconductor transistor layout according to claim 1, wherein said fourth conductive plane connects source contacts and well pickup contacts in said second area.

* * * * *

(12) EX PARTE REEXAMINATION CERTIFICATE (9327th)
United States Patent
Su et al.

(10) Number: US 7,132,717 C1
(45) Certificate Issued: Oct. 3, 2012

(54) POWER METAL OXIDE SEMICONDUCTOR TRANSISTOR LAYOUT WITH LOWER OUTPUT RESISTANCE AND HIGH CURRENT LIMIT

(75) Inventors: Hung-Der Su, Kao-Hsiung Hsien (TW); Chun-Yen Huang, Hsin-Chu (TW); Chung-Lung Pai, Taipei (TW); Jing-Meng Liu, Hsin-Chu (TW)

(73) Assignee: Richtek Technology Corp., Chupei, Hsinchu Hsien (TW)

Reexamination Request:
No. 90/011,183, Aug. 25, 2010

Reexamination Certificate for:
Patent No.: 7,132,717
Issued: Nov. 7, 2006
Appl. No.: 11/109,772
Filed: Apr. 20, 2005

(30) Foreign Application Priority Data

Dec. 24, 2004  (TW) ................ 93140491 A

(51) Int. Cl.
*H01L 29/94* (2006.01)

(52) U.S. Cl. ............... 257/401; 438/186; 257/E29.255; 257/E29.12; 257/E29.136; 257/E29.116; 257/E23.015

(58) Field of Classification Search ............. 257/401
See application file for complete search history.

(56) References Cited

To view the complete listing of prior art documents cited during the proceeding for Reexamination Control Number 90/011,183, please refer to the USPTO's public Patent Application Information Retrieval (PAIR) system under the Display References tab.

*Primary Examiner* — Cheng-Yuan Tseng

(57) ABSTRACT

A power metal oxide semiconductor transistor layout is disclosed. The power metal oxide semiconductor transistor layout uses network of conductive lead line as a connection or a network connection to connect source and drain regions thereby achieves advantages of a high uniformity of current, low Rds_on, much less power loss, an actual line density two times larger than that of conventional layouts and a strengthened resistance to electron migration.

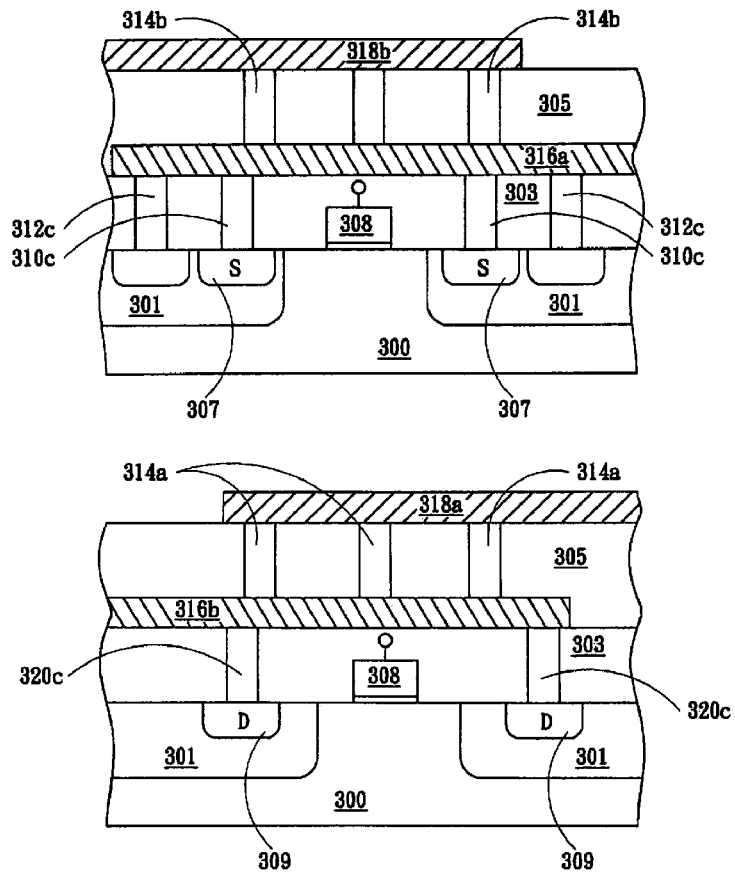

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-3 and 6-9 are cancelled.

Claims 4-5 and 10-14 were not reexamined.

\* \* \* \* \*